United States Patent [19]

Przybysz

[11] Patent Number: 4,859,879
[45] Date of Patent: Aug. 22, 1989

[54] SUPERCONDUCTING DIGITAL LOGIC AMPLIFIER

[75] Inventor: John X. Przybysz, Penn Hills, Pa.

[73] Assignee: Westinghouse Electric Corp., Pittsburgh, Pa.

[21] Appl. No.: 194,688

[22] Filed: May 16, 1988

[51] Int. Cl.⁴ .................. H03K 19/195; H03K 17/92
[52] U.S. Cl. ................................. 307/476; 307/475; 307/264; 307/462; 505/858; 505/861
[58] Field of Search ............. 307/306, 476, 277, 245, 307/541, 475, 264; 505/858, 861

[56] References Cited

U.S. PATENT DOCUMENTS

| Re. 31,485 | 1/1984 | Faris | 307/476 |
| 3,365,584 | 1/1968 | Bragg | 307/476 X |
| 4,371,796 | 1/1983 | Takada | 307/476 |
| 4,413,196 | 11/1983 | Josephs et al. | 307/306 X |
| 4,559,459 | 12/1985 | Wang et al. | 307/306 X |

*Primary Examiner*—Stanley D. Miller
*Assistant Examiner*—David R. Bertelson
*Attorney, Agent, or Firm*—R. A. Stoltz

[57] ABSTRACT

This is a superconducting digital logic amplifier for interfacing superconductor circuits with semiconductor circuits. It provides a gigahertz amplifier to convert low voltage superconducting logic signals to higher voltage signals, suitable for semiconductor signal processing circuits. It may, for example, provide a factor of ten voltage gain to raise the 2.5 mV Josephson logic signals of conventional metallic superconductor circuitry to 25 mV signals for input into inexpensive semiconductor amplifiers which, in turn, can power semiconductor logic circuitry. Generally, it utilizes a first series string of Josephson junctions in series with an input Josephson junction to provide a series combination which is then connected in parallel with a second string of higher critical current Josephson junctions. The input signal is introduced between the first series string and the input Josephson junction, and the output terminal is connected at the common connection opposite the input Josephson junction. A pulsed DC current source is also connected at the common connection with the output terminal. The current from Josephson junction logic circuitry is introduced through the input Josephson junction, exceeding its critical current and switching this Josephson junction to the resistive state, the combined input and current from the DC current source, then switch the Josephson junctions in the second series to the resistive state, and the DC current source finally switches Josephson junctions in the first string to the resistive state, giving an output voltage of the sum of all of the voltages across the Josephson junctions in the series strings. Thus, with nine Josephson junction in the first series string, plus the input Josephson junction in series with the first series string, and with ten Josephson junctions in the second series string, for example, the amplifier provides a factor of 10 in voltage between its input and output.

4 Claims, 2 Drawing Sheets

SUPERCONDUCTING DIGITAL LOGIC AMPLIFIER

CROSS-REFERENCE TO RELATED APPLICATION

A superconducting Josephson junction and a method for making such a Josephson junction is described in a related U.S. Pat. No. 4,768,069, filed on Mar. 23, 1987, and assigned to the same assignee. That related application utilizes a layer of niobium nitride on a substrate, an epitaxial layer of a pseudo-binary compound on the layer of niobium nitride, where the pseudo-binary compound has the composition about 3 atomic percent magnesium oxide—about 97 atomic percent calcium oxide, to about 97 atomic percent magnesium oxide—about 3 atomic percent calcium oxide, and an epitaxial layer of niobium nitride on the layer of pseudo-binary compound.

BACKGROUND OF THE INVENTION

1. Field of the Invention

This invention relates to an interface between digital Josephson junction circuitry and digital semiconductor signal processing circuits. In particular, it relates to a superconducting digital logic amplifier to provide a voltage gain to allow Josephson digital circuit signals to be fed into widely available semiconductor digital circuits.

2. Description of the Related Art

Josephson junctions are, of course, well known in the art. U.S. Pat. Nos. 4,432,134 issued Feb. 21, 1984, to Jones et al.; 4,242,419 issued Dec. 30, 1980, to Dayem et al.; 4,202,959 issued Sept. 2, 1980, to Kroger; and, 3,816,845 issued June 11, 1974, to Cuomo et al., give examples of Josephson junction configurations and processes for making them.

Circuitry using Josephson junction is shown in U.S. Pat. No. 3,458,735 issued July 29, 1969, to Fiske. Fiske teaches the use of individual electromagnetic control means to obtain a voltage output, where the voltage output is the sum of the individual control voltage. In a paper entitled "A Josephson Counter-Circuit with Two-Phase Power Supply" by Nakagawa et al. (Abstracts of the 17th Conference on Solid State Devices and Materials, Tokyo, 1985, pp. 123-126), a Josephson digital circuit is described which utilizes Josephson junctions to provide a data-latch function for a counter-circuit.

Recent advances in superconductivity may lead to widespread use of superconductor circuits in radar signal processing. The picosecond switching speed of Josephson junctions could be applied in an analog-to-digital converter capable of operation at X-band frequencies. High-speed shift registers are under development, which could be used to store the output of such an A/D convertor. A 10 GHz shift register could also be used to multiplex or demultiplex a fast data stream. While most development has been in the traditional metallic superconductors which operate at liquid helium temperature (4° Kelvin), this technology will generally be applicable to the new high temperature ceramic superconductors.

SUMMARY OF THE INVENTION

The logic levels in the superconductor circuit typically are 0 and 2.5 mV. If the superconductor circuit is to be interfaced with the semiconductor circuit, the 2.5 mV level must be amplified to drive the semiconductor logic. To avoid a multitude of output connections from the superconductor circuit, the data should be outputted to the semiconductor circuit at higher rates (e.g. 500–1000 MHz). Most semiconductor amplifiers require input signals of at least 20 mV at such data rates. This invention is a Josephson junction amplifier capable fo amplifying, for example, a 2.5 mV input signal to a 25 mV output at gigahertz data rates. Typically, semiconductor logic levels are 5 volts, and thus the output of the Josephson amplifier of this invention can be input into a semiconductor amplifier (which can be reasonably priced, requiring only a gain of 200, at gigahertz rates) which in turn drives the semiconductor logic circuitry (when the traditional metallic superconductors are used). It should be noted that the ceramic superconductors (e.g., yttrium-barium-copper-oxide) have an energy gap about 10 times larger than the metallic (e.g., niobium) superconductors, and thus, e.g., a ceramic superconductor amplifier of this invention might have a 25 mV input and a 250 mV output, and thus with ceramic superconductors, the output of an amplifier this invention may be used to drive extremely inexpensive semiconductor amplifier, as only a gain of about 20 would be required of the semiconductor amplifier to in turn drive the semiconductor logic circuitry.

Thus, this superconducting digital logic amplifier can interface between a low voltage Josephson junction circuit (e.g., 2.5 or 25 mV) and a higher voltage semiconductor circuit input (typically a semiconductor amplifier). The amplifier has an input terminal for connection to a Josephson logic circuitry output, an output terminal for connection to a semiconductor circuit input, an input, lower critical current, Josephson junction having first and second terminals; a first series string of at least three (e.g., nine) lower critical current Josephson junctions, with the first series string having a common connection with the first terminal of the input Josephson junction (thus, the first series string is in series with the input Josephson junction to provide a series combination), and with the input terminal being connected to the common connection of the input Josephson junction and the first series string, a second series string of at least four (e.g., ten) higher critical current Josephson junctions connected in parallel with the series combination with an upper common connection connected to the output terminal, and a lower common connection connected to the second terminal of the input Josephson junction, and a pulsed DC current source connected to the parallel strings at the upper connection. The lower critical current of the first series string and the input Josephson junctions is less than the output current of the Josephson junction logic circuit which is connected to the input terminal. The higher critical current of the second series string of Josephson junctions is higher than the aforementioned lower critical current, but equal to or lower than the current of the pulsed DC current source. Generally, the Josephson junction portion of the amplifier acts as a latch, being turned on by a signal from the Josephson junction logic circuit and staying on until the end of the pulse from the pulsed DC current source.

In one preferred embodiment, metallic-type superconductors are utilized, and there are at least nine Josephson junctions in the first series string (the input Josephson junction serving as the tenth junction in the series combination), and there are ten Josephson junctions in the second series string, providing an output voltage of ten times the voltage of the Josephson junctions.

BRIEF DESCRIPTION OF THE DRAWINGS

This invention can be best understood by reference to the following drawings in which.

DESCRIPTION OF THE PREFERRED EMBODIMENTS

This invention provides a very high speed, low input voltage amplifier to provide a higher voltage output for interfacing with semiconductor circuitry (currently only extremely expensive semiconductor amplifers are sensitive to signal voltages less than 20 mV at gigahertz rates needed to interface superconductor logic circuitry with semiconductor logic circuitry).

Figure 1:
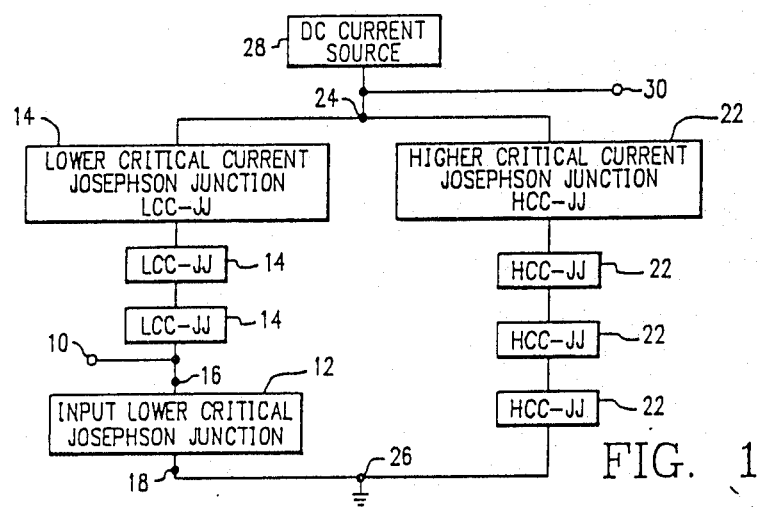
FIG. 1 is a block diagram showing the basic configuration of a superconducting digital logic amplifier.

FIG. 1 shows a configuration which would raise the voltage by a factor of 4. The input terminal 10 is connected between the input, lower critical, Josephson junction 12 and the lower critical current Josephson junction 14 of the first series string to provide a series combination which is connected in parallel with a second series string. The input Josephson junction has a first terminal 16 and a second terminal 18, with the first terminal 16 being connected to one end of the first series string and also the input terminal 10. The second series string comprises higher critical current Josephson junctions 22. The parallel strings have an upper common connection 24 and a lower common connection 26, with the lower common connection 26 being connected to second terminal 18 of the input Josephson junction 12. A pulsed DC current source 28 is connected to the parallel strings at the upper common connection 24, and the output terminal 30 is also connected at the upper common connection 24.

Figure 2:
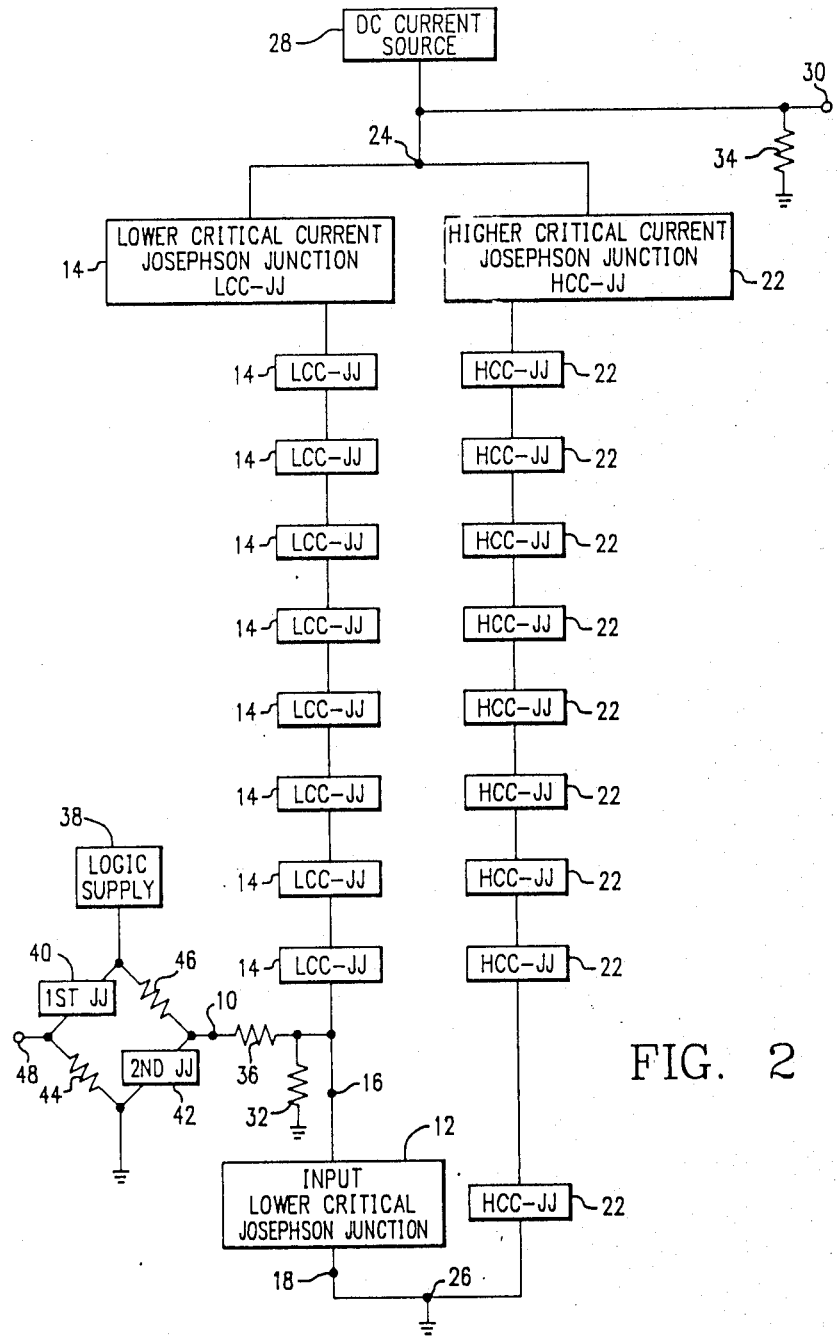
FIG. 2 shows a block diagram of a preferred embodiment for metallic-type superconductors having an output voltage of ten times its input voltage.

FIG. 2 shows a configuration which a simulation demonstrated to have a factor of 10 voltage gains. The amplifier circuit provided an effective means to use the voltage from a single Josephson junction to switch ten Josephson junctions to the resistive state. Before the input signal was applied, the amplifier pulsed DC current source 28 flowed to ground through the two strings of Josephson junctions (through junctions 14 and 12 and the parallel path through junctions 22). When the input signal was applied, the input current combined with current from the DC current source to switch the input junction 12 to the resistive state. Then, both these currents tried to flow to gorund through the junctions 22 (since this was the only remaining superconductive path-to-ground), but the combined currents switched the string junctions 22 to the resistive state (as the input current plus the current from the DC current source was greater than the critical current of the higher critical current Josephson junctions 22). Finally, the DC current source current tried to flow to ground through the nine superconducting junctions 14 (here then through a 0.5 ohm resistor 32); the junctions 14 also switched to a resistive state. Here, the power supply was directed to a 20-ohm output resistor 34 and the output voltage appears at output terminal 30. Here, the output voltage is that of ten Josephson junctions in series, and thus can be ten times the input voltage.

The switching of the digital logic amplifier is similar to the switching sequence in a four-junction logic (4JL) OR-gate as described in the aforementioned Nakagawa paper. Those gates were used to steer currents around a logic circuit and to obtain input/output isolation. They are not intended for use as voltage amplifiers, although a factor of 2 increase in voltage is possible. The 4JL OR-gate is often applied in the 3:1 critical currents ratio to obtain current amplification.

The digital logic amplifier of this invention is very fast, and the turn-on delay between the application of the input voltage and the rise of the output voltage was only 14 picoseconds. This compares well with the 10 picosecond delay between the input data signal and the response of a Josephson OR-gate. In FIG. 2, a 1.2 ohm amplifier input resistor is used between the input terminal 10 and the input Josephson junction first terminal 18. The amplifier input in FIG. 2 is shown as receiving an input current from a superconducting OR-gate, the superconducting OR-gate having a logic supply 38 (e.g., 1.3 mA), a first Josephson junction 40 (e.g., 0.5 mA critical current), and a second Josephson junction 42 (e.g., a 1.0 mA critical current), and a 0.3 ohm resistor 44 and a 0.15 ohm resistor 46. The OR-gate response to a 1.0 mA data signal introduced into data terminal 48 will provide a 10 picosecond delay in the OR-gate (38, 40, 42, 46, 48), and thus with a 14 picosecond delay the digital logic amplifier is only slightly slower.

Figure 3:
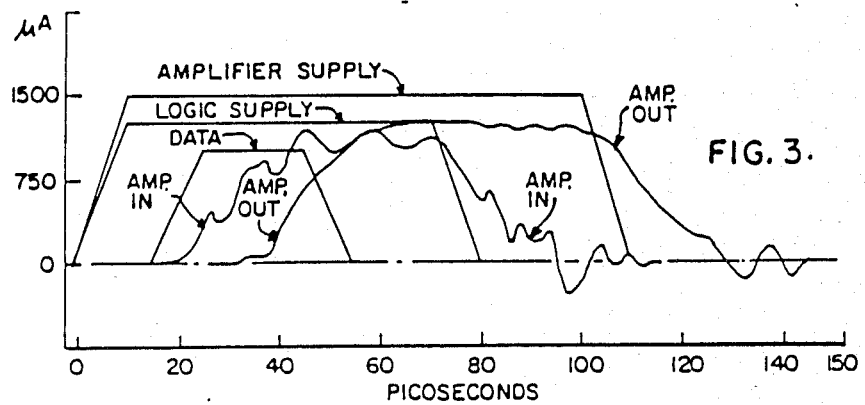
FIG. 3 is a graph of simulated performance showing input and output currents versus time in picoseconds.
Figure 4:
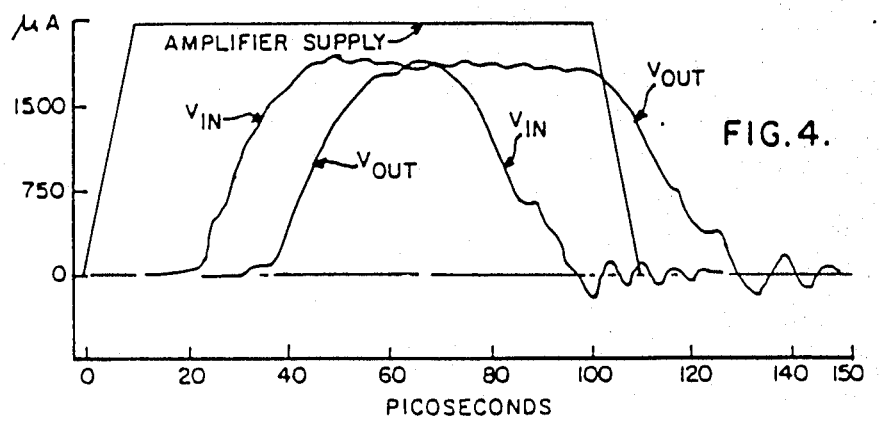
FIG. 4 is a graph similar to FIG. 3 but showing voltages (rather than currents).

The currents that flowed during the computer simulation are shown in FIG. 3. The power supplies (logic supply 38 and pulsed DC current source 28) were activated during the first 10 picoseconds. The data "1" pulse started at 15 picoseconds, activated the OR-gate, and ended at 55 picoseconds. The OR-gate directed a current pulse into the amplifier, starting at about 30 picoseconds, and ending when the OR-gate power supply fell to 0, at about 80 picoseconds. The amplifier output current began to flow 14 picoseconds after the start of the input current. It continued to flow until the amplifier power supply fell to 0, at 110 picoseconds. The fall time of the output current was 12 picoseconds. The amplifier input voltage and output voltage are shown in FIG. 4, along with the amplifier power supply (the DC pulse current source 28) current. The scale for the input voltage was 1 mV per division and the scale for the output voltage was 10 MV per division, and thus the input signal voltage was 2.5 mV and the amplifier circuit produced an output voltage of 25 mV. With the rise time and fall time of the output signal of 10 and 12 picoseconds, respectively, one may conservatively estimate that this circuit could be tuned to operate at 10 GHz.

The amplifier described here is not a linear amplifier, as the output signal level is fixed (e.g., at 25 mV) for all input signals that exceed the threshold value. Sub-threshold inputs, of course, result in a 0 output. Note also, that the amplifier acts as a data latch that holds the output data after the input signal is finished (until the power supply current drops). Generally, Josephson logics gates exhibit this latching behavior.

It is anticipated that the higher temperature ceramic superconductor circuits will have a factor of 10 improvement in speed over the conventional metallic superconductors. It is known that the materials limit on conventional metallic superconductors such as niobium is about 750 GHz, and thus one would anticipate a materials limited circuit speed for ceramic superconductors of about 7,500 GHz.

The amplifier described in FIG. 2 provides a factor of 10 voltage gains, for example, to raise 2.5 mV Josephson logic signals to 25 mV signals for input into inexpensive semiconductor amplifiers. The Josephson junction amplifier can operate at gigahertz rates, to output large quantities of data through a single port.

Thus, it can be seen that the superconductor amplifier described herein solves the inportant problem of interfacing superconductor circuits with semiconductor circuits. It provides a gigahertz amplifier to convert low voltage superconductor logic signal to higher voltage signals, suitable for reasonably priced semiconductor amplifiers which in turn can drive semiconductor logic circuits.

The invention is not to be construed as limited to the particular examples described herein, as these are to be regarded as illustrative, rather than restrictive. The invention is intended to cover all devices which do not depart from the spirit and scope of the invention.

I claim:

1. A superconducting digital logic amplifier for interfacing between a Josephson junction logic circuit having output current and a higher voltage semiconductor circuit input, said amplifier comprising:
   a. an input terminal for connection to a
   b. an output terminal for connection to a semiconductor circuit input;
   c. an input, lower critical current, Josephson junction having first and second terminals;
   d. a first series string of at least three lower critical current Josephson junctions, said first series string being connected to said first terminal of said input Josephson junction such that the first series string is in series with said input Josephson junction to provide a series combination, and said input terminal being connected to said first terminal of said input Josephson junction, and with said critical current of said lower critical current Josephson junctions of said input Josephson junction and said first series stirng Josephson junctions being less than the output current of said low voltage Josephson junction circuit;
   e. a second series string of at least four higher critical current Josephson junctions, said second string being connected in parallel with said series combination to provide parallel strings having an upper common connection and a lower common connection, said lower common connection being connected to said second terminal of said input Josephson junction and said upper common connection being connected to said output terminal; and
   f. a pulsed DC current source connected to said parallel strings at said upper common connection, said DC current source having a current at least equal to the critical current of said higher critical current Josephson junctions.

2. The amplifier of claim 2, wherein there are at least nine Josephson junctions in said first series string, at least ten Josephson junctions in said second series string, whereby the voltage of the higher voltage semiconductor circuit can be ten times the voltage of the low voltage Josephson junction logic circuit.

3. The amplifier of claim 2, wherein the critical current of said lower current Josephson junctions is about 0.5 milliamp and the critical current of said higher current Josephson junctions is about 1.5 milliamps.

4. The amplifier of claim 3, wherein the pulsed DC power supply current is about 1.5 milliamp and the Josephson junction logic circuit output current is about 1.3 milliamp.

* * * * *